US007710015B2

(12) United States Patent
Matsudate et al.

(10) Patent No.: US 7,710,015 B2
(45) Date of Patent: May 4, 2010

(54) SELF-EMITTING DISPLAY

(75) Inventors: Noriharu Matsudate, Kujukuri (JP);
Hirotsugu Sakamoto, Chiba (JP)

(73) Assignee: Hitachi Displays, Ltd., Mobara-shi (JP)

( * ) Notice: Subject to any disclaimer, the term of this patent is extended or adjusted under 35 U.S.C. 154(b) by 924 days.

(21) Appl. No.: 11/098,449

(22) Filed: Apr. 5, 2005

(65) Prior Publication Data
US 2005/0236970 A1    Oct. 27, 2005

(30) Foreign Application Priority Data
Apr. 7, 2004    (JP) .............................. 2004-113476

(51) Int. Cl.
*H01J 33/04*    (2006.01)
(52) U.S. Cl. ...................... 313/500; 313/504
(58) Field of Classification Search ......... 313/498–512; 428/690
See application file for complete search history.

(56) References Cited
U.S. PATENT DOCUMENTS
6,366,025 B1 *    4/2002   Yamada ................... 315/169.3
6,867,549 B2 *    3/2005   Cok et al. ................ 315/169.3
7,091,941 B2 *    8/2006   Arnold et al. ................. 345/83
2002/0140645 A1 *    10/2002   Sato et al. ..................... 345/82
2003/0142043 A1 *    7/2003   Matsueda .................... 345/30

FOREIGN PATENT DOCUMENTS
JP    10-39791    2/1998

\* cited by examiner

*Primary Examiner*—Nimeshkumar D Patel
*Assistant Examiner*—Anne M Hines
(74) *Attorney, Agent, or Firm*—Antonelli, Terry, Stout & Kraus, LLP.

(57) ABSTRACT

An aperture LAR of a light-emitting portion is changed in diameter (size) from the center portion of a screen to the peripheral portion thereof. In this manner, any displacement observed between the aperture LAR and a vapor deposition region VAR of an organic EL material is controlled. The aperture LAR is preferably larger in size at the center portion of the screen, and smaller in the peripheral portion thereof. As such, a light-emitting layer is vapor-deposited on a substrate correctly for every pixel so that a high-quality self-emitting display including organic EL display can de derived.

6 Claims, 7 Drawing Sheets

SELF-EMITTING DISPLAY

CROSS-REFERENCE TO RELATED APPLICATIONS

The disclosure of Japanese Patent Application No. 2004-113476 filed on Apr. 7, 2004 including the specification, drawings and abstract is incorporated herein by reference in its entirety.

BACKGROUND OF THE INVENTION

1. Field of the Invention

The present invention relates to flat panel displays and, more specifically, to a display suitably serving as a self-emitting display providing better positioning accuracy between a power supply line and pixels, and providing high-quality display by controlling the signal voltage not to decrease that much even if the wiring of the power supply line is increased in length.

2. Description of the Related Art

Flat-panel self-emitting displays include plasma display panels (PDPs), field emission displays (FEDs), organic electroluminescence displays (organic EL displays, referred also to as OLEDs), and others, which are already commercially available or are currently underway for commercial production. The organic EL displays are typical of thin-and-light self-emitting displays, and considered quite promising as future displays. The organic EL displays are of so-called bottom emission type or top emission type.

The organic EL display of a bottom emission type has the light-emitting mechanism configuring an organic EL device. The light-emitting mechanism includes an insulation substrate preferably made of glass. This glass substrate carries thereon, in the order of, a transparent electrode exemplified by Indium Tin Oxide (ITO) serving as a first electrode, an organic multilayer film, and a reflective metal electrode serving as a second electrode. Herein, the first electrode is referred also to as "one electrode", and extending in a first direction. The second electrode is referred also to as "the other electrode", and extending in a second direction. The organic multilayer film is referred also to as "organic light-emitting layer", and emits light in response to electric field application. The resulting organic EL device is plurally arranged in a matrix, and their multilayer structure is covered by another substrate referred to as sealing can so that the light-emitting structure is protected from the outer atmosphere. The electric field is applied between an anode, e.g., the transparent electrode, and a cathode, e.g., the metal electrode, and carriers (electrons and positive holes) are responsively injected to the organic multilayer film so that the film emits light. The light emitted by the organic multilayer film is directed to the outside from the side of the glass substrate.

In the organic EL display of a top emission type, on the other hand, the electric field is applied between one electrode of a reflective metal electrode and the other electrode of a transparent electrode such as ITO, and responsively the organic multilayer film emits light. The light emitted by the organic multilayer film is directed from the side of the other electrode. With such a top emission type, a transparent plate preferably made of glass is used as an alternative to the sealing can with the bottom emission type.

A PDP or FED is a display having a light-emitting mechanism including a first glass substrate carrying thereon a first electrode extending in the first direction and a discharge cell or an electronic source, and a second glass substrate carrying thereon a fluorescent layer. In the PDP or FED, the light-emitting mechanism is plurally arranged in a matrix.

Any related conventional technology is found in Patent Document 1 (JP-A-2001-160362), and Patent Document 2 (JP-A-7-288087). Patent Document 1 describes a shadow mask for a color picture tube, made of a metal plate formed with a plurality of apertures. Patent Document 2 describes a PDP in which a scanning electrode is changed in width at the center portion of the panel and the peripheral portion thereof.

SUMMARY OF THE INVENTION

The self-emitting display of the above type configures a light-emitting mechanism including an organic light-emitting layer on the first electrode, or discharge cells or an electronic source. Such a configuration requires to position the light-emitting mechanism on the first electrode with accuracy. For this matter, an organic EL display is exemplified below.

A light-emitting layer of the organic EL display is formed in various manners. In an exemplary manner, a vapor deposition mask made of thin plate is used to form a light-emitting layer on a substrate, generally a glass substrate. The vapor deposition mask is formed with a plurality of apertures each corresponding to a pixel. In the case of forming a light-emitting layer by vapor deposition using such a vapor deposition mask, there arise problems associated with the following reasons.

1. For use, fixed to frame with tension.
2. In a vapor deposition process for a light-emitting layer, always heated by a vapor deposition source.
3. Although heated by the vapor deposition source, cooled by a low-temperature substrate (rapid contact cooling) after every exchange for vapor deposition.
4. The alignment mechanism is used for positioning between the vapor deposition mask and the substrate.

As a result, the resulting light-emitting layer is displaced in three directions of X, Y, and θ. The direction of X is a direction in the plane, the direction of Y is orthogonal to the direction of X in the plane, and the direction of θ is the rotation direction in the plane. The vapor deposition mask can be designed with compensation or tolerance for such displacements observed at the vapor deposition position in the directions of X, Y, and θ. The problem here is that designing the mask with tolerance in the direction of θ is higher in technical difficulty than applying compensation in the direction of X and Y.

An object of the present invention is to provide, with the above-described problems solved, a high-quality self-emitting display including organic EL display by vapor-depositing a light-emitting layer on a substrate with accuracy for every pixel.

In order to achieve the above object, a self-emitting display of the present invention is structured as below. By way of example, an organic EL display as part of the self-emitting display is characterized in that 1. the apertures of light-emitting portions are changed in diameter (size) from the center portion of the screen toward the peripheral portion thereof, and
2. the apertures of the light-emitting portions at the center portion of the screen are preferably larger in diameter (area away from the peripheral portion of the screen), and smaller in diameter at the peripheral portion of the screen.

Note here that a film of a vapor deposition material (organic material for organic EL displays) is not necessarily proportional in area size to each corresponding apertures (light-emitting portions) formed at the center and peripheral portions of the screen, and may be of the same size for the entire screen. In other words, the material film formed (vapor-deposited) to the apertures at the peripheral portions of the screen will lie off the edge (contour) of the apertures to a greater degree than the material film formed to the apertures at the area away from the peripheral portions. With an organic EL display, for the purpose of electrically isolating a pair of electrodes from each other with the material film (including organic material film serving as the light-emitting portion) therebetween, the material film is preferably formed larger than the corresponding aperture. In the manufacture process of a field emission display, for vapor-depositing a field emission material to apertures formed to a base, the material film may be formed smaller than each corresponding apertures. The typical structure of the present invention is described as below.

a. A self-emitting display includes a display screen with a plurality of pixels that are two-dimensionally arranged along a first direction and a second direction that is orthogonal to the first direction. In the self-emitting display, N (where N is an integer of 3 or more) of the pixels form a pixel row along the first direction. In the pixel row, a light-emitting region provided to both the 1st and Nth pixels is narrower in width along the first direction than a light-emitting region provided to the Mth (where M is an integer, satisfying 1<M<N) pixel.

b. The integer M is a value equal to ½ of the integer N, or a value derived by rounding up ½ of the integer N.

c. A pixel line is formed with n of the pixels arranged along the second direction, and a light-emitting region provided to both the 1st and nth pixels is narrower in width along the second direction than a light-emitting region provided to the mth (where m is an integer, satisfying 1<m<n) pixel.

In such a display, the maximum design index for the aperture diameter of the light-emitting portion is 100%, and the minimum design index therefor is 50% so that the intensity level can be made uniform on the display. In the resulting organic EL display, the signal line is graded in width, i.e., the signal line in the peripheral portion of the screen is designed thicker than that in the center portion thereof, so that the performance characteristics and the display quality can be both improved.

With such designing, the following advantages are favorably derived.

1. The display of a low-molecular light-emitting material for an organic EL can be increased in size, e.g., larger than 17 inches, nominal.

2. The displacement in the direction of θ is taken care of in the process of vapor-depositing a light-emitting layer, and thus the manufacturing tolerance is improved in the vapor deposition process in the organic EL display, favorably leading to better yield.

3. Organic EL display can be easily increased in size.

4. The varying widths of the signal line can control the signal voltage not to decrease that much, successfully leading to better performance characteristics and display quality of the resulting organic EL display.

5. With higher accuracy at the time of vapor-depositing a light-emitting layer, the display can have higher definition, and with less signal voltage reduction from the peripheral portion of the screen to the center portion thereof, the screen can be uniform in display intensity.

This is applicable not only to the above organic EL displays of a low-molecular light-emitting material but also to organic EL displays of a high-molecular light-emitting material, or self-emitting displays of any other types, e.g., PDPs and FEDs, specifically to form electrodes and fluorescent bodies provided with electronic sources. With self-emitting displays, the manufacturing tolerance associated with screen size increase is dominantly controlled by the aperture design for the light-emitting portion. The design approach of the present invention applied to the aperture diameter is to increase the manufacturing tolerance, thereby enabling increasing the manufacturing tolerance of general flat panel displays.

Because the flat panel displays are made airtight and protected from the air, a signal line is provided from the peripheral portion of the screen (contour part of the flat panel display) for driving the display. Thus, the larger the size of the flat panel display, the longer the signal line will be, and thus the signal voltage is inevitably reduced. According to the present invention, on the other hand, by grading the width of the signal line, the signal voltage can be controlled not to decrease that much.

DETAILED DESCRIPTION OF THE INVENTION

In the below, an embodiment of the present invention is described in detail by referring to the accompanying drawings. Described below is an organic EL display using a low-molecular light-emitting material.

A light-emitting layer is displaced in position at the time of vapor deposition, and this is basically due to the thermal expansion of a glass substrate and a vapor deposition mask, or an alignment error of the glass substrate with respect to the vapor deposition mask.

Figure 1:
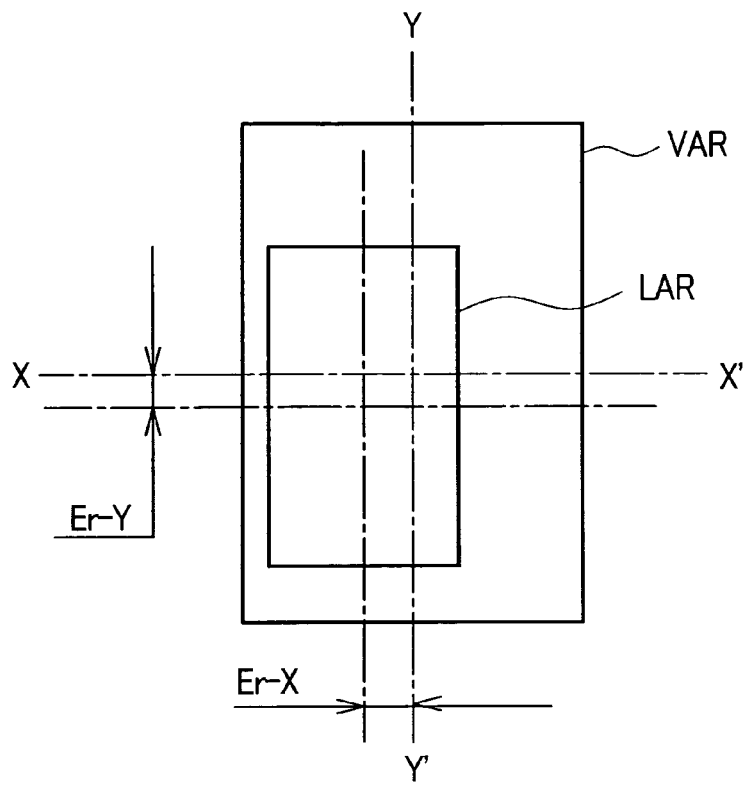
FIG. 1 is a diagram for illustrating the positional relationship, on a glass substrate of an organic EL, between an aperture of a light-emitting portion (pixel) and a vapor deposition region of a light-emitting material for the organic EL.

FIG. 1 is a diagram for illustrating the positional relationship, on a glass substrate of an organic EL, between an aperture of a light-emitting portion (pixel) and a vapor deposition region of a light-emitting material for the organic EL. In FIG. 1, LAR denotes an aperture of a light-emitting portion, VAR denotes a vapor deposition region, and X-X' denotes a first direction in the plane of the glass substrate, and Y-Y' denotes a second direction thereof. Also in the drawing, the displacement in the direction of X is indicated by Er-X, and the displacement in the direction of Y is indicated by Er-Y. Considering the process of vapor-depositing a light-emitting material for an organic EL, the displacement observed at the time of vapor deposition is classified into four as below.

Figure 2:
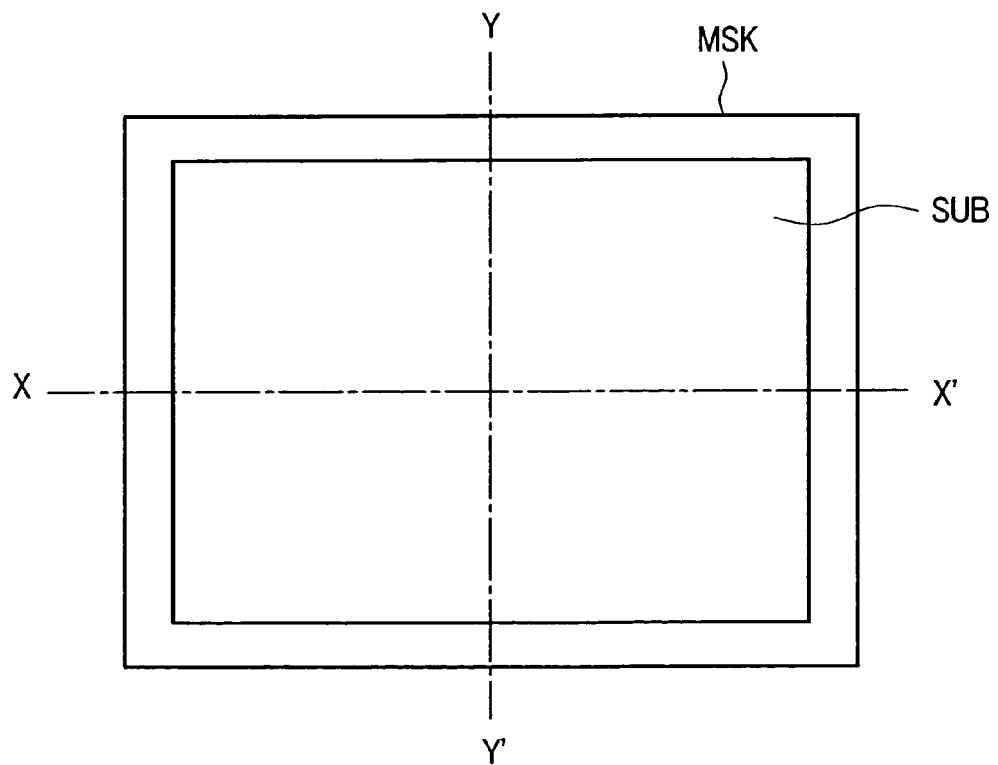
FIG. 2 is a plan view showing the correct positioning between the glass substrate and a vapor deposition mask.

FIG. 2 is a plan view showing the correct positioning between the glass substrate and a vapor deposition mask. A glass SUB is fixed to a vapor deposition mask MSK at a predetermined position, and under this state, a process is executed to vapor deposit a light-emitting material for an organic EL. The organic EL light-emitting material evaporated from a vapor deposition source that is not shown is vapor-deposited to the vapor deposition region VAR through apertures formed to the vapor deposition mask. Herein, the vapor deposition region VAR is predetermined for the aperture LAR formed on the glass substrate SUB.

Figure 3:
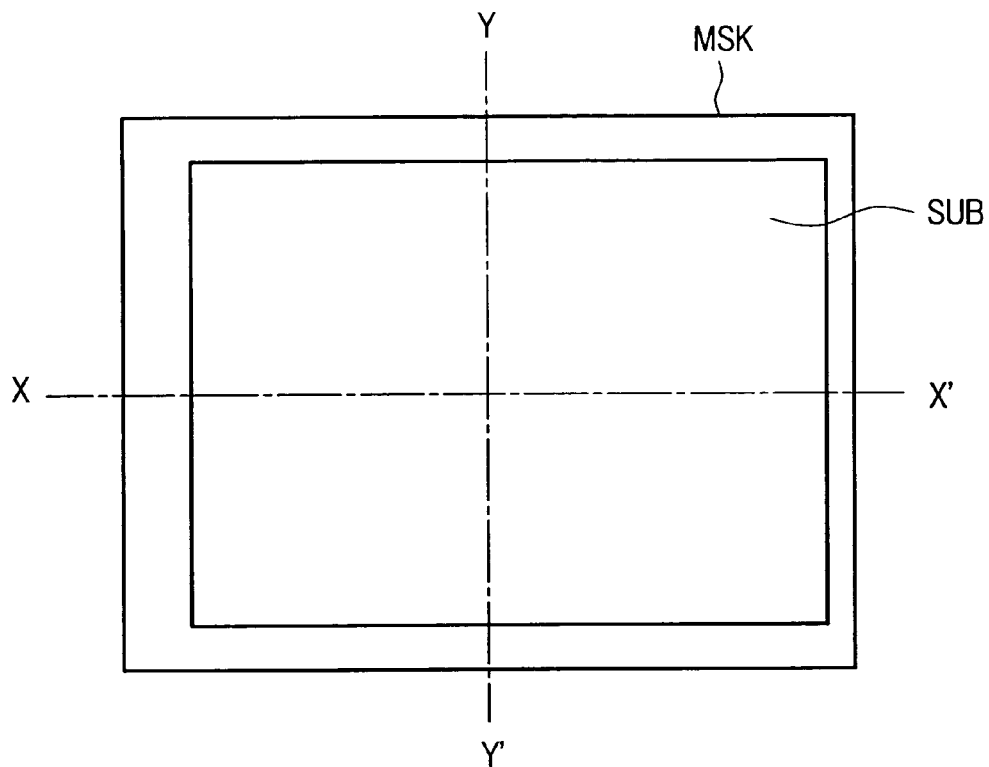
FIG. 3 is a plan view showing the displacement observed between the glass substrate and the vapor deposition mask in a direction of X.
Figure 4:
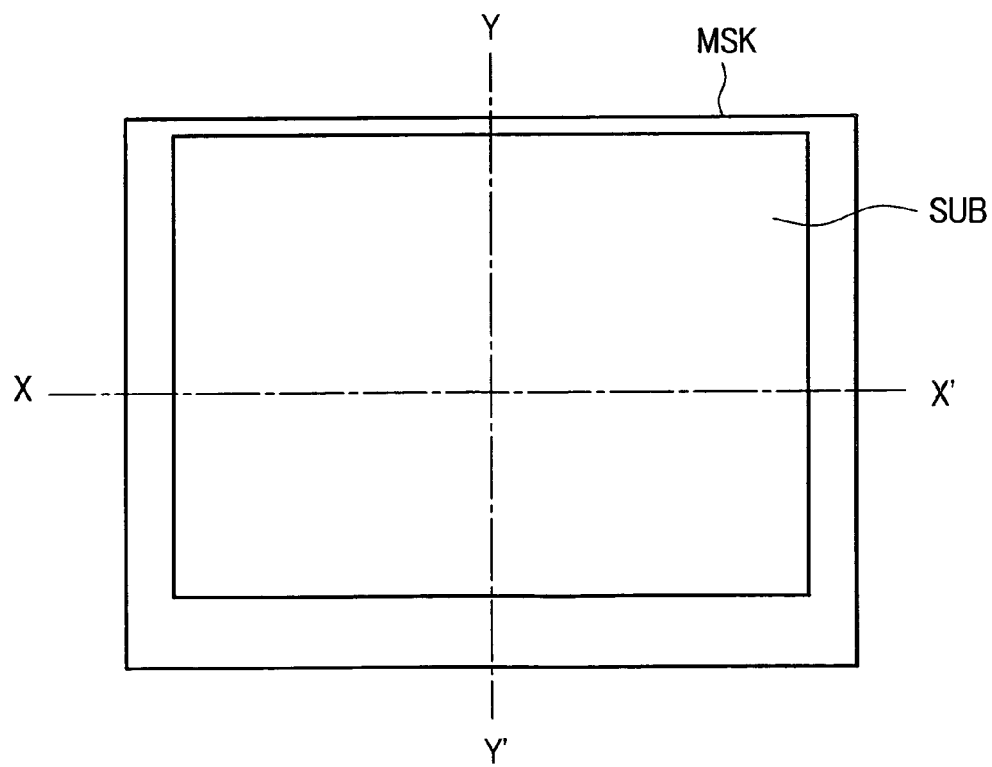
FIG. 4 is a plan view showing the displacement observed between the glass substrate and the vapor deposition mask in a direction of Y.
Figure 5:
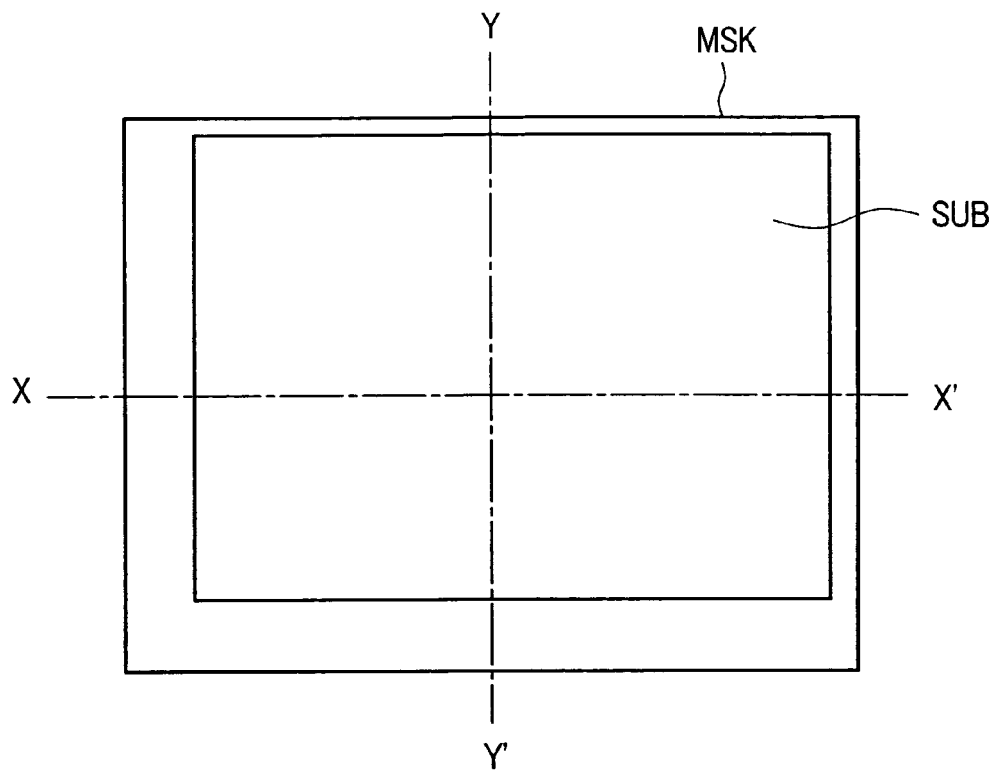
FIG. 5 is a plan view showing the displacement observed between the glass substrate and the vapor deposition mask both in the directions of X and Y.
Figure 6:
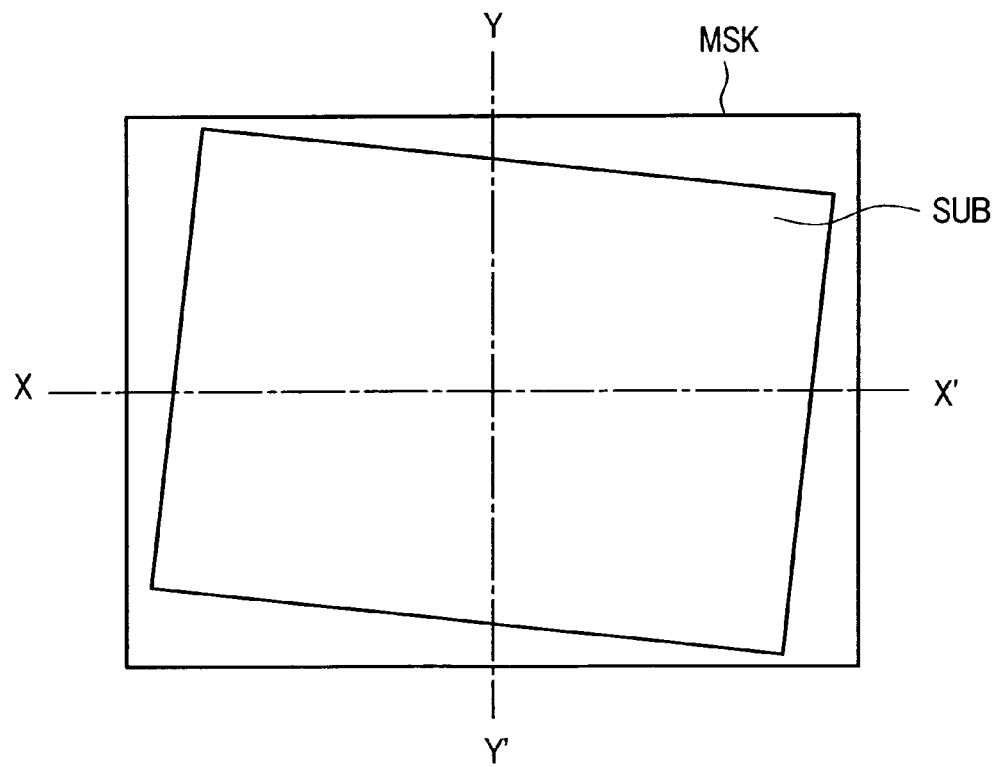
FIG. 6 is a plan view showing the displacement observed between the glass substrate and the vapor deposition mask in a direction of θ.

FIG. 3 is a plan view showing the displacement observed between the glass substrate and the vapor deposition mask in the direction of X. FIG. 4 is a plan view showing the displacement observed between the glass substrate and the vapor deposition mask in the direction of Y. FIG. 5 is a plan view showing the displacement observed between the glass substrate and the vapor deposition mask both in the directions of X and Y. FIG. 6 is a plan view showing the displacement observed between the glass substrate and the vapor deposition mask in the direction of θ. The displacement actually observed is mostly the combination of FIGS. 5 and 6.

Figure 7:
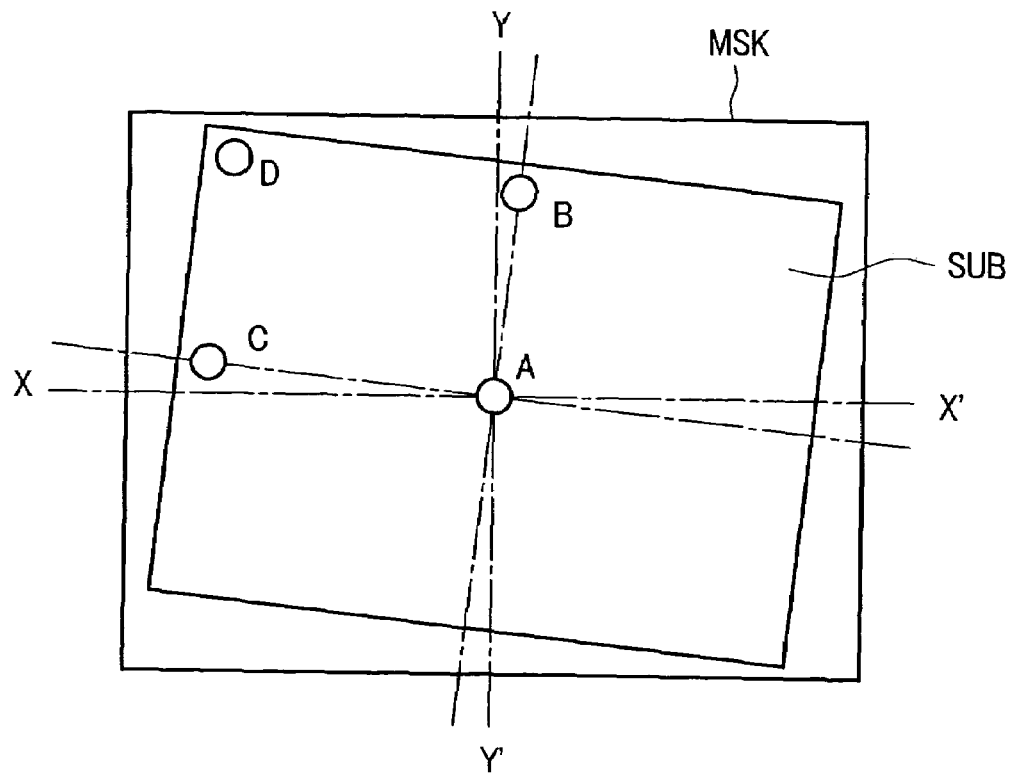
FIG. 7 is a plan view for illustrating in more detail the actual displacement observed between the glass substrate and the vapor deposition mask.

FIG. 7 is a plan view for illustrating in more detail the actual displacement observed between the glass substrate and the vapor deposition mask. The displacement shown in FIGS. 3 to 5 is basically the same at any arbitrary point on the glass substrate. In FIG. 6, the displacement in the direction of θ is increased with distance from the center portion of the glass substrate. In FIG. 7, a point A indicates the center portion of the glass substrate, a point B indicates an end portion of a Y axis, a point C indicates an end portion of an X axis, and a point D indicates an end portion of a diagonal axis.

In FIG. 7, the following equations 1 and 2 are the same.

1. Distance from the center portion of glass substrate $$A \leq B \leq C \leq D \qquad \text{Equation 1}$$

2. Amount of displacement at the time of vapor deposition $$A \leq B \leq C \leq D \qquad \text{Equation 2}$$

Accordingly, the vapor deposition margin has to satisfy the relationship as indicated by the equation 2. For this purpose, the present invention has two characteristics: a first characteristic lies in the aperture diameter of a vapor evaporation mask, being maximum at the center portion of a screen, and decreasing with distance therefrom; and a second characteristic lies in the width of a power line for driving pixels of an organic EL, being wider in the peripheral portion of the screen in which a space between apertures is increased by the first characteristic.

Figure 8:
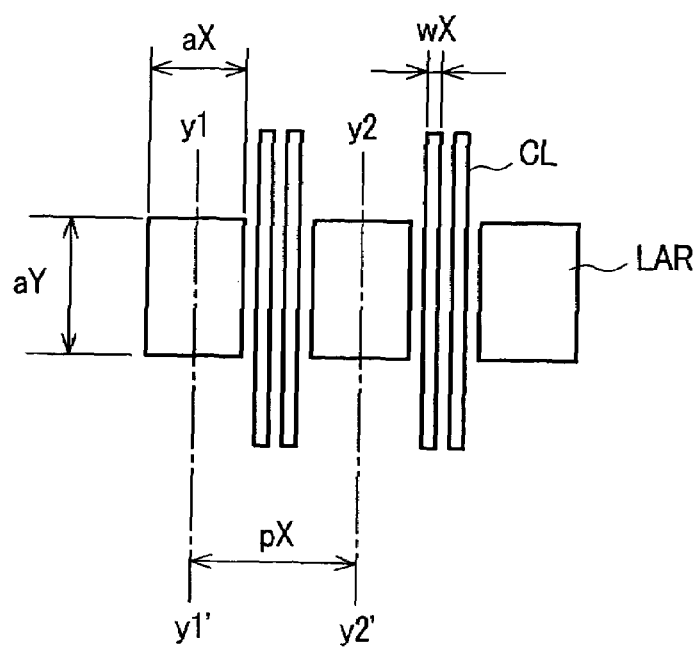
FIG. 8 is a schematic plan view for illustrating exemplary designs of light-emitting portions (pixels) and drive power lines in an organic EL display.

FIG. 8 is a schematic plan view for illustrating exemplary designs of light-emitting portions (pixels) and drive power lines in an organic EL display. In FIG. 8, between any two apertures LAR in the direction of X, there are two power lines CL extending in the direction of Y. The aperture LAR has the size of aX in the direction of X, and aY in the direction of Y. The space is pX, between center lines y1-y1' and y2-y2' extending in the direction of Y and passing through, respectively, the centers of the apertures LAR adjacent to each other in the direction of X, and the width of the respective drive power lines CL is wX. Table 1 below shows an exemplary design of an organic EL display of 21 inches, nominal, specifically for the points of A to D shown in FIG. 7.

[Table 1]

TABLE 1

Exemplary Design of 21-inch OLED Display

| ITEM/<br>MEASUREMENT<br>POINT | A | B | C | D |
|---|---|---|---|---|
| aX | 100.0 | 60.0 | 80.0 | 60.0 |
| aY | 120.0 | 120.0 | 80.0 | 100.0 |
| pX | 135.0 | 135.0 | 135.5 | 135.0 |
| wX | 7.0 | 27.0 | 7.0 | 27.0 |

Unit: μm

First Embodiment

Figure 9:
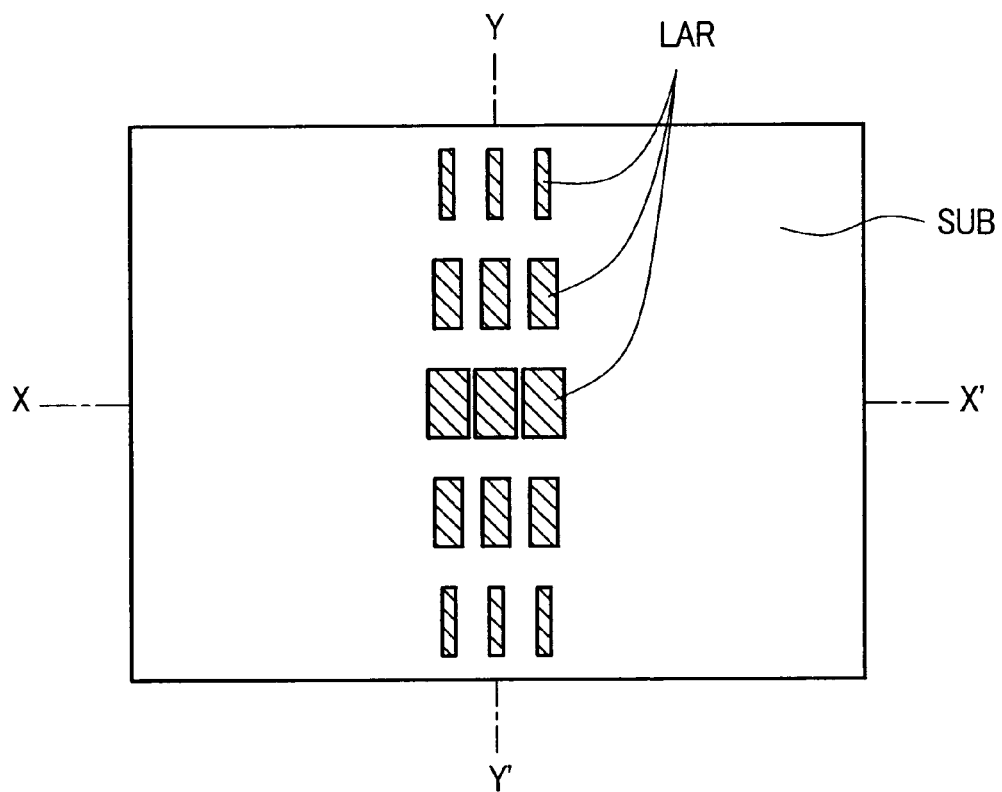
FIG. 9 is a schematic plan view of apertures of light-emitting apertures illustrating a first embodiment of the present invention.
Figure 10:
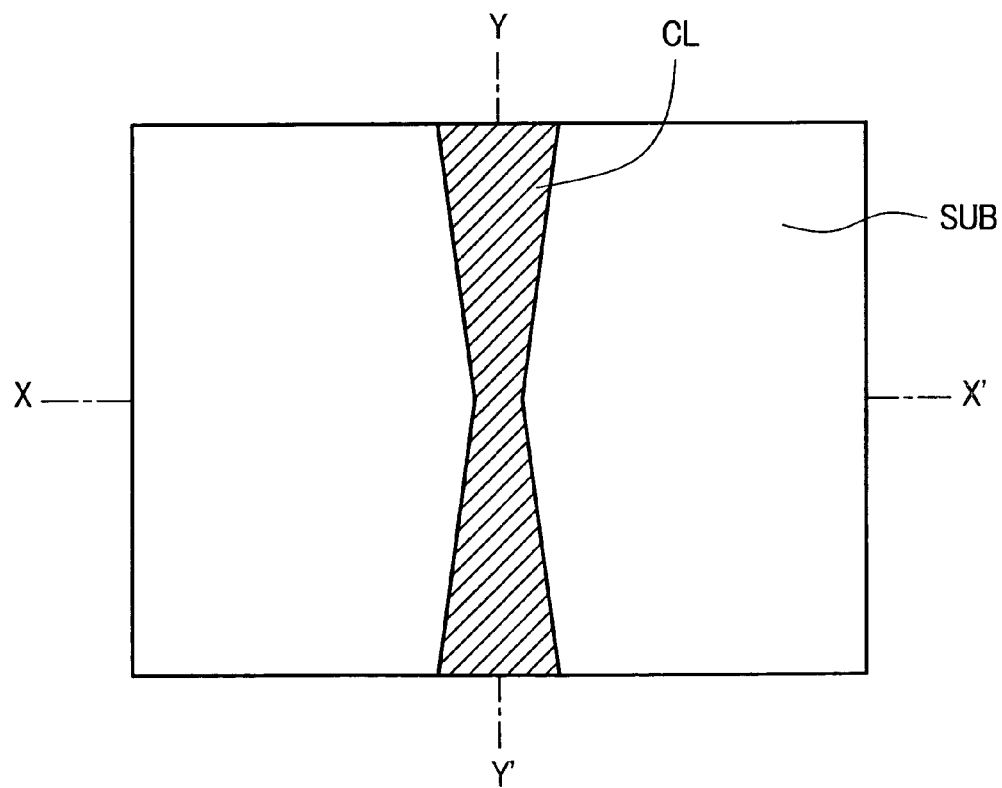
FIG. 10 is a schematic plan view of a signal line illustrating the first embodiment of the present invention.

FIG. 9 is a schematic plan view of an aperture of a light-emitting portion illustrating a first embodiment of the present invention. Exemplarily shown here are only three aperture rows at the center portion of a screen in the direction of Y-Y'. The size of the aperture LAR is largest at the center portion of the screen, and the width in the direction of X is graded so as to be narrowed by degrees with distance therefrom in the direction of Y-Y'. FIG. 10 is a schematic plan view of a signal line illustrating the first embodiment of the present invention. Shown here is only a signal line (drive power line) CL extending in the direction of Y-Y' at the center portion of the screen.

As shown in FIG. 10, the power line CL formed on the glass substrate SUB is narrow at the center portion, and increasing in width by degrees in the direction of X with distance therefrom in the direction of Y-Y'.

In the organic EL displays of the present embodiment, a yield of almost 100% is achieved with grading applied to the aperture diameter, compared with a yield of 60% or less in the conventional organic EL displays with no such grading. What is more, in the organic EL displays of the present invention, thanks to the width change made to the power line, the voltage is successfully controlled not to decrease more than 1.5V. This solves the problem of difficult to drive the organic EL displays due to the voltage decrease of 8V or more with the conventional wiring width of 7 μm even.

As a result, the organic EL display of 21 inches, nominal, presents no problem and is driven with the conventional drive circuit design. The same effects can be derived also in an alternative structure, i.e, the pitch (pixel pitch) of aperture LAR may be changed by degrees from the center portion of the screen to the peripheral portion thereof ("variable pitch"), and the aperture diameter may be fixed or varied in size.

Figure 11:
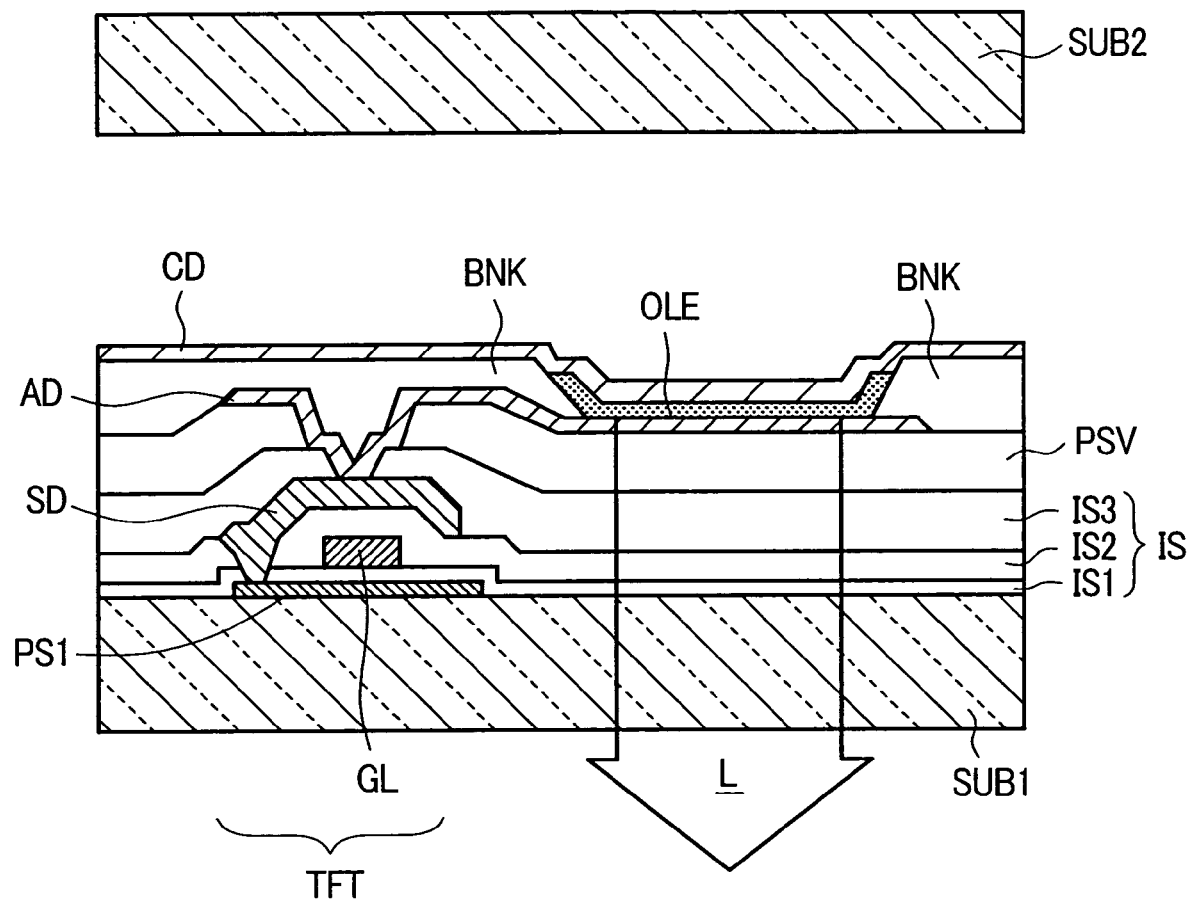
FIG. 11 is a cross sectional view for illustrating an exemplary structure of an organic EL display of a bottom emission type to which the present invention is applied, specifically in the vicinity of an organic EL device, i.e., a pixel.

FIG. 11 is a cross sectional view for illustrating an exemplary structure of an organic EL display of the present invention, specifically in the vicinity of an organic EL device, i.e., a pixel. The organic EL display of FIG. 11 is of a bottom emission/active matrix type. The glass substrate SUB1 carries on its main surface a thin-film transistor TFT. This thin-film transistor TFT drives two electrodes of an anode AD and a cathode CD, and a light-emitting layer OLE is placed therebetween so that a light-emitting portion is formed. Herein, the thin-film transistor TFT is configured by a polysilicon semiconductor layer PS1, a gate insulation layer IS1, a gate lead (gate electrode) GL, a source/drain electrode SD, and an interlayer insulation layers IS2 and IS3.

The anode AD serving as a pixel electrode is a transparent conductive layer, e.g., ITO, formed on the upper layer of a passivation layer PSV, and electrically connected to the source/drain electrode SD of the thin-film transistor TFT by a contact hole formed to the passivation layer PSV and the interlayer insulation layer IS3. The passivation layer PSV is formed thereon an insulation film BNK, which covers as far as the upper end part of the anode AD. The insulation film BNK is formed by coating or vapor-depositing its material on the passivation layer PSV, and formed with an aperture in such a manner that the upper surface of the anode AD exposes, preferably excluding the peripheral portion thereof. This aperture is vapor-deposited with an organic material, and the light-emitting layer OLE is formed on the anode AD. The light-emitting layer OLE extends over the slanting surface of the aperture formed to the insulation film BNK, which rises from the upper surface of the anode AD to the upper surface of the insulation film BNK. The insulation film BNK is formed with apertures with a one-to-one correspondence with a plurality of pixels provided in the screen. Thereafter, the apertures are respectively formed with the light-emitting layer OLE, and the resulting insulation film BNK and light-emitting layers OLE formed to the apertures are covered by the cathode CD. The cathode CD serves as a so-called common electrode for the light-emitting layers OLE formed to the pixels. By going through such a process, the pixels provided in the screen are each formed with an organic EL device.

The apertures formed on the above-described insulation film BNK partition the light-emitting layers OLE for the organic EL devices provided in the screen. The insulation film BNK is referred to as bank because of its appearance as "bank" partitioning any adjacent light-emitting layers OLE. In the apertures going through the insulation layer (bank) BNK to reach the upper surface of the anode AD, an organic material is vapor-deposited so that the light-emitting layer OLE is formed. Thus, the apertures formed to the insulation film BNK are the apertures LAR shown in FIGS. 1, 8, and 9.

Corresponding to the vapor deposition region VAR shown in FIG. 1, the organic material that is vapor-deposited to the apertures of the insulation film BNK forms the light-emitting layers OLE on the apertures of the insulation film BNK and therearound. The organic material film may lie off each of the apertures (the upper surface of the insulation film BNK) as far as not covering their adjacent apertures on the insulation film BNK.

This light-emitting layer OLE may include not only a layer observed with a light emission phenomenon but also other material layer(s) (organic material layer(s)) for lamination thereon. Other than such a layer observed with a light emission phenomenon, i.e., other material layers, the light-emitting layer OLE may include a hole transport layer and a hole injection layer for placement between the anode AD and the layer observed with a light emission phenomenon, and an electron transport layer and an electron injection layer for placement between the cathode CD and the layer observed with a light emission phenomenon. The light-emitting layer OLE may include all or any one of these four layers, or none of those. When all of those four layers are included, the layers are accumulated, on the anode AD, in the order of the hole transfer layer, the hole injection layer (layer observed with a light emission phenomenon), the electron injection layer, and the electron transport layer. This selection is dependent on the use purpose of displays, and the type of organic materials.

This organic EL display called "bottom emission type" emits light L from the surface of the glass substrate SUB1 to outside as indicated by an arrow. Here, the light L is the one coming from the light-emitting layer. In this sense, the cathode CD is regarded as having the light reflex. On the main surface side of the glass substrate SUB1, a sealing can SUB2 (sealing glass substrate) is attached so that the sealed content around the peripheral portion (not shown) is vacuum-sealed.

Figure 12:
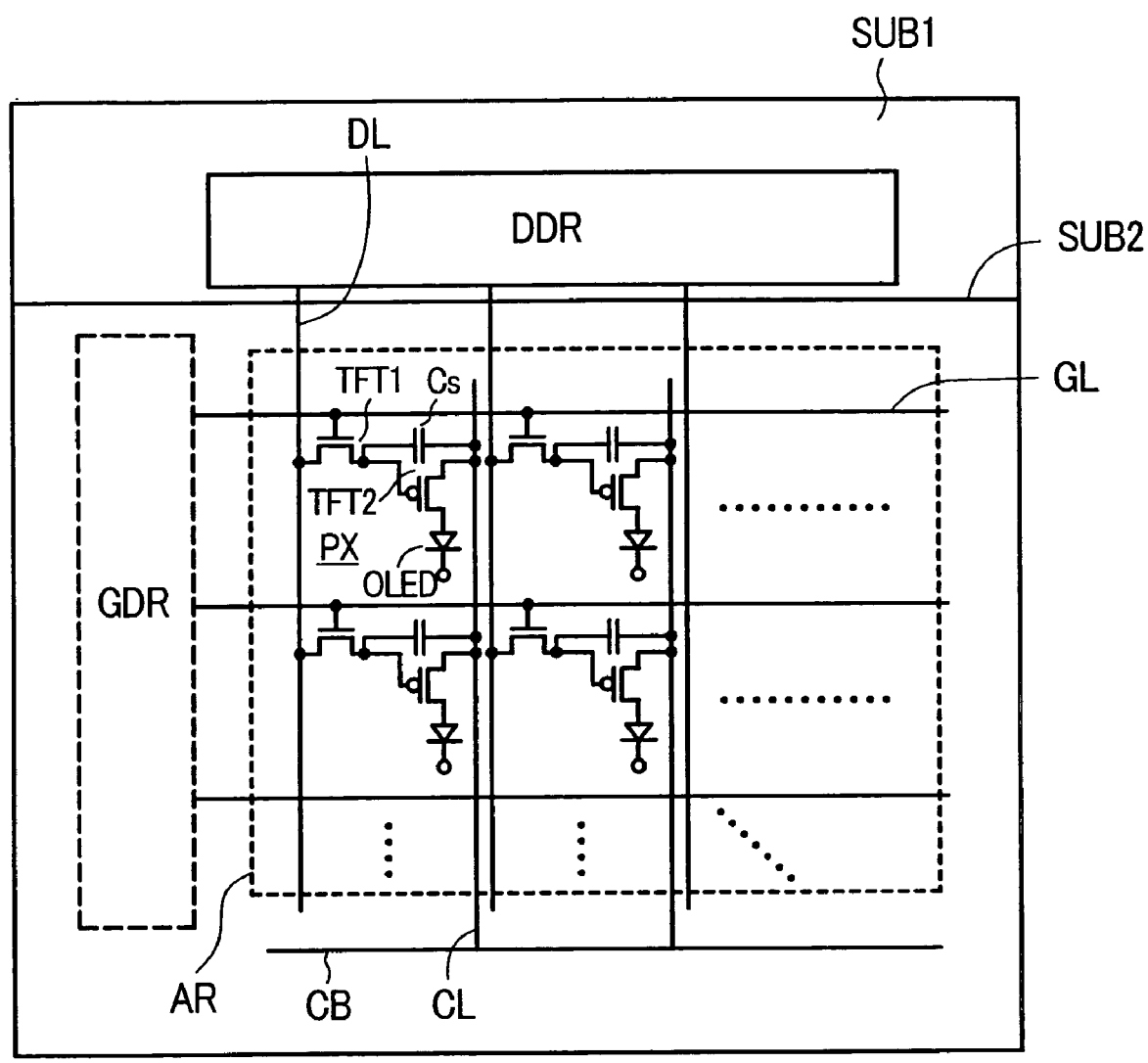
FIG. 12 is an equivalent circuit for illustrating the entire structure of an organic EL display of an active matrix type of the present invention.

FIG. 12 shows an equivalent circuit for illustrating the entire structure of an exemplary organic EL display. This two-dimensional display includes a plurality of pixels PX in a matrix in a display region AR. The pixel PX has a pixel circuit of the organic EL in the structure described by referring to FIG. 11. The pixel PX is configured by a first thin-film transistor TFT1, a second thin-film transistor TFT2, a capacitor Cs, and an organic EL device OLED. The organic EL device OLED is configured by the anode AD, the organic light-emitting layer OLE, and the cathode CD, all both of which are shown in FIG. 11. In the display region AR, a drain lead DL and a gate lead GL are intersected. The glass substrate SUB1 is larger than the glass substrate configuring the sealing can SUB2, and thus lies off the edge of the sealing can SUB2. The part thus lied off the edge is provided with a drain driver-DDR, and supplies a display signal to the drain lead DL.

The gate driver GDR is directly formed, in the manner so-called system-on-glass, on the glass substrate SUB1 covered by the sealing can SUB2. The gate driver GDR is connected with the gate lead GL. In the display region AR, the power line CL is placed. The power line CL is connected to an external power source via a power bus line CB using a terminal that is not shown. Here, the system-on-glass is not the only option, and alternatively, a semiconductor chip may be provided.

The gate lead GL is connected to one of the source/drain electrode (drain electrode in this example) of the first thin-film transistor TFT1 configuring the pixel PX, and the drain lead DL is connected to the other source/drain electrode (source electrode in this example). The first thin-film transistor TFT1 is a switch for capturing a display signal into the pixel PX, and when the switch is turned on through selected by the gate lead GL, the electric charge corresponding to the display signal thus coming from the drain lead DL is stored in the capacitor Cs. When the first thin-film transistor TFT1 is turned off, the second thin-film transistor TFT2 is responsively turned on, and supplies the current corresponding to the size (ex. the voltage) of the display signal stored in the capacitor Cs to the organic EL device OLED from the power line CL. The organic EL device OLED emits light in accordance with the provided amount of current.

The present invention is applicable to general organic EL displays. Especially when the present invention is applied to large-screen organic EL displays for television receivers, the displacement between apertures to be vapor-deposited by a light-emitting layer and their corresponding vapor deposition regions can be controlled, successfully achieving a high manufacturing yield.

What is claimed is:

1. A self-emitting display in which an organic EL device including a pair of electrodes and a light-emitting layer therebetween is plurally arranged in a matrix in a display region of a screen, and one of the electrodes is connected with a current supply line via a thin film transistor, wherein the current supply line extends to a side of the matrix, and the current supply line is continuously narrowed in width in the display region from a peripheral portion of the screen toward a center portion of the screen so that the width of the current supply line is wider at the peripheral portion of the screen than at the center portion of the screen.

2. The self-emitting display according to claim 1, further comprising:

an insulation film with an aperture portion plurally arranged in a matrix in a display region of a screen, wherein each of the aperture portions enable display within the display region of the screen; and a light-emitting material of the light emitting layer being placed in the aperture portion;

wherein a non-emitting portion between the aperture portions adjacent to each other at a peripheral portion of the display region of the screen is wider in width than the non-emitting portion between the aperture portions adjacent to each other at a center portion of the display region of the screen; or wherein at least one of the adjacent aperture portions at the peripheral portion of the display region of the screen is narrower in width than at least one of the adjacent aperture portions at the center portion of the display region of screen.

3. The self-emitting display according to claim 1 further comprising:

an insulation film with aperture portions arranged in a matrix in a display region of a screen, wherein each of the aperture portions enable display within the display region of the screen; and a light-emitting material of the light-emitting layer being placed in the aperture portion;

wherein a non-emitting portion between the aperture portions adjacent to each other is increased in width from a center portion of the display region of the screen toward a peripheral portion of the display region of the screen; or wherein at least one of the adjacent aperture portions is decreased in width from the center portion of the display region of the screen toward the peripheral portion of the display region of the screen.

4. The self-emitting display according to claim 1, wherein the screen includes a plurality of pixels which are two-dimensionally arranged along a first direction and a second direction that is orthogonal to the first direction, wherein N (where N is an integer of 3 or more) of the pixels forms an entire N pixel row along the first direction of the display screen, and in the entire N pixel row, a light-emitting region provided to both the 1st and Nth pixels at both end portions of the entire N pixel row is narrower in width along the first direction than a light-emitting region provided to the Mth (where M is an integer, satisfying $1<M<N$) pixel of the entire N pixel row.

5. The self-emitting display according to claim 4, wherein the integer M is a value equal to ½ of the integer N, or a value derived by rounding up ½ of the integer N.

6. The self-emitting display according to claim 4, wherein a pixel line is formed with n of the pixels arranged along the second direction of the display screen so as to form an entire n pixel line, and a light-emitting region provided to both the 1st and nth pixels at both end portions of the entire n pixel line is narrower in width along the second direction than a light-emitting region provided to the mth (where m is an integer, satisfying $1<m<n$) pixel of the entire n pixel line.

* * * * *